United States Patent
Davidson

(10) Patent No.: US 9,972,997 B2
(45) Date of Patent: May 15, 2018

(54) CIRCUIT INTERRUPTION DEVICE

(71) Applicant: ALSTOM Technology Ltd, Baden (CH)

(72) Inventor: Colin Charnock Davidson, Stafford (GB)

(73) Assignee: General Electric Technology GmbH, Baden (CH)

( * ) Notice: Subject to any disclaimer, the term of this patent is extended or adjusted under 35 U.S.C. 154(b) by 533 days.

(21) Appl. No.: 14/423,067

(22) PCT Filed: Jul. 2, 2013

(86) PCT No.: PCT/EP2013/063940
§ 371 (c)(1),
(2) Date: Feb. 20, 2015

(87) PCT Pub. No.: WO2014/029542
PCT Pub. Date: Feb. 27, 2014

(65) Prior Publication Data
US 2015/0229121 A1 Aug. 13, 2015

(30) Foreign Application Priority Data
Aug. 23, 2012 (EP) ..................................... 12275124

(51) Int. Cl.
*H02H 3/08* (2006.01)
*H02H 3/087* (2006.01)
(Continued)

(52) U.S. Cl.
CPC .............. *H02H 9/02* (2013.01); *H02H 3/087* (2013.01); *H02H 9/04* (2013.01); *H02H 9/043* (2013.01);
(Continued)

(58) Field of Classification Search
CPC ............. H02H 9/02; H02H 3/08; H02H 3/087
(Continued)

(56) References Cited

U.S. PATENT DOCUMENTS 6,160,689 A 12/2000 Stolzenberg
6,697,955 B1 * 2/2004 Malik ..................... H02J 9/061
713/300
(Continued)

FOREIGN PATENT DOCUMENTS

CN 101140839 A 3/2008
EP 0785625 7/1997
(Continued)

OTHER PUBLICATIONS

Hafner, J. et al., "Proactive Hybrid HVDC Breakers—A key innovation for reliable HVDC grids," CIGRE Symposium, Bologna, Italy, (Sep. 2011).
(Continued)

Primary Examiner — Dharti Patel
(74) Attorney, Agent, or Firm — GE Global Patent Operation; Scott R. Stanley

(57) ABSTRACT

A switching device (28) comprising a primary switching block (30) including at least one semiconductor switch (34); and a switching control unit (32) to control the switching of the or each semiconductor switch (34). The switching device further includes a crowbar circuit (46) comprising a crowbar switch (56) switchable to selectively allow current to flow through the crowbar switch (56) in order to bypass the or each switching module; and a secondary switching block including a switching element (58) connected across a control electrode and a cathode of the crowbar switch (56). The switching element (58) is in communication with the switching control unit (32) to receive, in use, a control signal (66) generated by the switching control unit (32) when the
(Continued)

Figure 1:
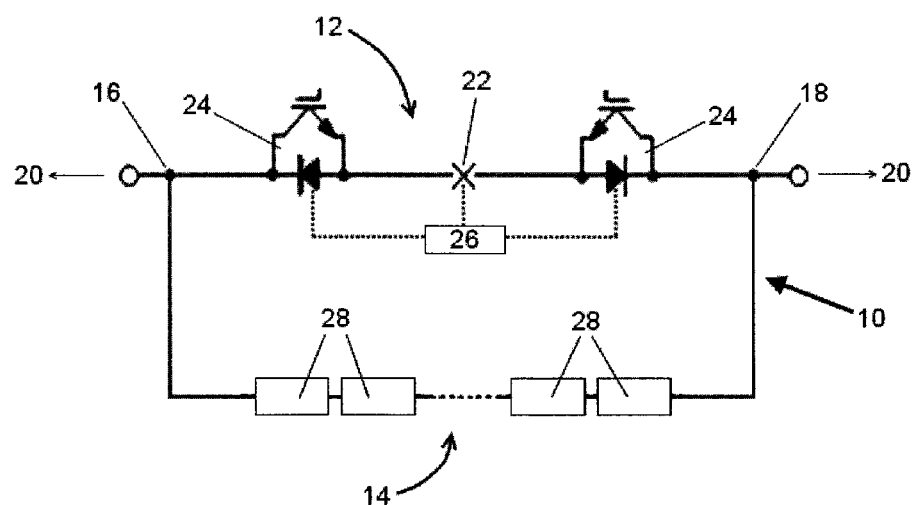

primary switching block (30) is operating within predefined operating parameters.

16 Claims, 4 Drawing Sheets

(51) Int. Cl.
   *H02H 9/02* (2006.01)
   *H02H 3/10* (2006.01)
   *H02H 9/04* (2006.01)
   *H03K 17/0814* (2006.01)
   *H03K 17/082* (2006.01)
   *H03K 17/12* (2006.01)
   *H03K 17/30* (2006.01)
   *H03K 17/73* (2006.01)

(52) U.S. Cl.
   CPC ... *H03K 17/0828* (2013.01); *H03K 17/08148* (2013.01); *H03K 17/127* (2013.01); *H03K 17/305* (2013.01); *H03K 17/73* (2013.01)

(58) Field of Classification Search
   USPC ........................... 361/54, 91.1, 93.1
   See application file for complete search history.

(56) References Cited

U.S. PATENT DOCUMENTS

| | | | |
|---|---|---|---|
| 7,253,540 | B1 | 8/2007 | Thalheim et al. |
| 2006/0181818 | A1 | 8/2006 | Drubel et al. |
| 2008/0055795 | A1 | 3/2008 | Miller |
| 2011/0299204 | A1 | 12/2011 | Appere et al. |
| 2012/0007657 | A1 | 1/2012 | Naumann et al. |

FOREIGN PATENT DOCUMENTS

| | | |
|---|---|---|
| EP | 0 867 998 B1 | 9/1998 |
| EP | 0 967 721 A2 | 12/1999 |
| EP | 1 220 417 A2 | 7/2002 |
| EP | 1855365 | 11/2007 |
| EP | 2 669 921 A1 | 12/2013 |
| EP | 2 701 254 A1 | 2/2014 |
| FR | 1357974 | 4/1964 |
| FR | 1357975 | 4/1964 |
| GB | 2273832 | 6/1994 |
| JP | H08-308252 A | 11/1996 |
| JP | 2009-273280 A | 11/2009 |
| WO | WO-2011/057675 A1 | 5/2011 |
| WO | WO-2011/141052 A1 | 11/2011 |
| WO | WO-2011/141054 A1 | 11/2011 |
| WO | WO-2011/141428 A1 | 11/2011 |
| WO | WO-2012/100831 A1 | 8/2012 |
| WO | WO-2012/104371 A1 | 8/2012 |
| WO | WO-2012/104377 A1 | 8/2012 |
| WO | WO-2013/092873 A1 | 6/2013 |
| WO | WO-2013/092878 A1 | 6/2013 |
| WO | WO-2013/127462 A1 | 9/2013 |
| WO | WO-2013/127463 A1 | 9/2013 |
| WO | WO-2013/178696 A1 | 12/2013 |
| WO | WO-2014/029886 A1 | 2/2014 |

OTHER PUBLICATIONS

English-language machine translation of WO 2012/104371, Alstom Technology Ltd. (Aug. 9, 2012).
English-language machine translation of WO 2012/104377, Alstom Technology Ltd. (Aug. 9, 2012).
English-language machine translation of WO 2013/092873, Alstom Technology Ltd. (Jun. 27, 2013).
English-language machine translation of WO 2013/092878, Alstom Technology Ltd. (Jun. 27, 2013).
English-language machine translation of FR 1357974, Consortium Fuer Elektrochemische Industrie GMBH (Apr. 10, 1964).
English-language machine translation of FR 1357975, Machf Werklust (Apr. 10, 1964).
English-language machine translation of JP 2009273280, Hitachi Ltd. (Nov. 19, 2009).
English-language machine translation of Abstract, JP H08-308252, Toshiba Corp. (Nov. 22, 1996).
International Search Report for PCT Application No. PCT/EP2013/063940, dated May 11, 2013, 4 pages.

* cited by examiner

CIRCUIT INTERRUPTION DEVICE

CROSS REFERENCE TO RELATED APPLICATIONS

The present application is a National Stage of International Application No. PCT/EP2013/063940, filed Jul. 2, 2013, which claims priority to European Application No. 12275124.1, filed Aug. 23, 2012, which is incorporated herein by reference in its entirety.

This invention relates to a switching device, a circuit interruption device comprising at least one such switching device, and a crowbar circuit, for use in high voltage direct current (HVDC) power transmission.

In power transmission networks alternating current (AC) power is typically converted to direct current (DC) power for transmission via overhead lines and/or undersea cables. This conversion removes the need to compensate for the AC capacitive load effects imposed by the transmission line or cable, and thereby reduces the cost per kilometer of the lines and/or cables. Conversion from AC to DC thus becomes cost-effective when power needs to be transmitted over a long distance.

The conversion of AC to DC power is also utilized in power transmission networks where it is necessary to interconnect AC networks operating at different frequencies. In any such power transmission network, converters are required at each interface between AC and DC power to effect the required conversion.

HVDC converters are vulnerable to DC side faults or other abnormal operating conditions that can present a short circuit with low impedance across the DC power transmission lines or cables. Such faults can occur due to damage or breakdown of insulation, lightning strikes, movement of conductors or other accidental bridging between conductors by a foreign object.

The presence of low impedance across the DC power transmission lines or cables can be detrimental to a HVDC converter. Sometimes the inherent design of the converter means that it cannot limit current under such conditions, resulting in the development of a high fault current exceeding the current rating of the HVDC converter. Such a high fault current not only damages components of the HVDC converter, but also results in the HVDC converter being offline for a period of time. This results in increased cost of repair and maintenance of damaged electrical apparatus hardware, and inconvenience to end users relying on the working of the electrical apparatus. It is therefore important to be able to interrupt the high fault current as soon as it is detected.

A conventional means of protecting a HVDC converter from DC side faults, in cases where the converter control cannot limit the fault current by any other means, is to trip an AC side circuit breaker, thus removing the supply of current that feeds the fault through the HVDC converter to the DC side. This is because there are currently no commercially available HVDC circuit breaker designs. Furthermore, almost all HVDC schemes are currently point-to-point schemes with two HVDC converters connected to the DC side, whereby one HVDC converter acts as a power source with power rectification capability and the other HVDC converter acts as a power load with power inversion capability. Hence, tripping the AC side circuit breaker is acceptable because the presence of a fault in the point-to-point scheme requires interruption of power flow to allow the fault to be cleared.

A new class of HVDC power transmission networks are being considered for moving large quantities of power over long distances, as required by geographically dispersed renewable forms of generation, and to augment existing capabilities of AC power transmission networks with smart-grid intelligence and features that are able to support modern electricity trading requirements.

Such a HVDC power transmission network requires multi-terminal interconnection of HVDC converters, whereby power can be exchanged on the DC side using three or more HVDC converters operating in parallel. Each HVDC converter acts as either a source or sink to maintain the overall input-to-output power balance of the network whilst exchanging the power as required. Faults in the HVDC power transmission network need to be quickly isolated and segregated from the rest of the network in order to enable the network to resume normal power transmission as soon as possible.

Current interruption in conventional AC circuit breakers is carried out when the current reaches a current zero, so as to considerably reduce the difficulty of the interruption task. Thus, in conventional circuit breakers, there is a risk of damage to the current interruption apparatus if a current zero does not occur within a defined time period for interrupting the current. It is therefore inherently difficult to carry out DC current interruption because, unlike AC current in which current zeros naturally occur, DC current cannot naturally reach a current zero.

EP 0 867 998 B1 discloses a solid-state DC circuit breaker comprising a stack of series-connected IGBTs in parallel with a metal-oxide surge arrester. This solution achieves a response time in the range of a few milliseconds but suffers from high steady-state power losses.

According to a first aspect of the invention, there is provided a switching device comprising:
  a primary switching block including:
    at least one switching module, the or each switching module including at least one semiconductor switch switchable to selectively allow current to flow through that switching module; and
    a switching control unit to control the switching of the or each semiconductor switch;
  wherein the switching device further includes a crowbar circuit,
  the crowbar circuit comprising:
    a crowbar switch switchable to selectively allow current to flow through the crowbar switch in order to bypass the or each switching module; and
    a secondary switching block including a switching element connected across a control electrode and a cathode of the crowbar switch, the switching element being switchable to selectively allow a non-zero voltage to be applied across the control electrode and cathode in order to either keep the crowbar switch in an off-state or switch the crowbar switch to an on-state,
    wherein the switching element is switched on in order to keep the crowbar switch in the off-state when the switching element receives, in use, a control signal, and the switching element is switched off in order to switch the crowbar switch to the on-state when the switching element does not receive, in use, a control signal, and
    the switching element is in communication with the switching control unit to receive, in use, a control signal generated by the switching control unit when the primary switching block is operating within predefined operating parameters.

The number of switching modules and semiconductor switches in the primary switching block may vary depending on the current and voltage requirements of the switching device.

During normal operation of the switching device, the switching control unit controls the switching of the or each semiconductor to turn on or off to control the flow of current through the primary switching block and therefore the switching device. When the or each semiconductor switch and the switching control unit of the primary switching block is operating within predefined operating parameters, i.e. they are functioning normally, the switching control unit generates a control signal and sends the control signal to the switching element. The switching control unit continuously generates the control signal and sends the control signal to the switching element as long as the or each semiconductor switch and the switching control unit of the primary switching block are operating within the predefined operating parameters.

On receipt of the control signal from the switching control unit, the switching element is switched on, i.e. it is closed, or stays switched on if it is already switched on. This results in connection of the control electrode and cathode of the crowbar switch, via the closed switching element. This means that a non-zero voltage cannot be applied across the control electrode and cathode of the crowbar switch in order to switch the crowbar switch to its on-state. As such, the crowbar switch is kept in its off-state and does not conduct any current.

In the event of failure of the switching control unit, the or each semiconductor switch cannot be controlled to turn on to allow current to flow through the corresponding switching module. This could adversely affect the ability of the switching device to safely conduct current. Similarly, in the event of failure of one or more semiconductor switches that results in an open-circuit condition, the inability to turn on the or each failed semiconductor switch could also adversely affect the ability of the switching device to safely conduct current. Consideration of the latter situation is particularly important for switching devices with at least one switching module including one or more commercially available semiconductor switches (such as IGBTs) that normally fail in an open-circuit failure mode.

Failure of the switching control unit and/or one or more semiconductor switches means that the primary switching block is unable to operate within the predefined operating parameters. This causes the switching control unit to automatically stop generating the control signal. The predefined operating parameters of the primary switching block may be selected so that failure of a plurality of semiconductor switches, instead of only a single semiconductor switch, can happen before the switching control unit stops generating the control signal.

When the switching element does not receive any control signal from the switching control unit, the switching element is switched off, i.e. it is opened. The open state of the switching element results in disconnection of the control electrode and cathode of the crowbar switch. This means that a non-zero voltage can be applied across the control electrode and cathode of the crowbar switch in order to switch the crowbar switch to its on-state, so that the crowbar switch may conduct current. In this manner the crowbar switch provides an alternative, safe current path for any current flowing through the switching device, thus allowing the switching device to safely conduct current.

The crowbar switch may be, but is not limited to, a solid-state switch (e.g. a thyristor), a thyratron or a triggered spark gap.

Preferably the crowbar switch has a short-circuit failure mode in which, upon failure of the crowbar switch, the failed crowbar switch forms a short circuit that permits, in use, current to pass through the crowbar switch. For example, such a crowbar switch may be a pressure-bonded thyristor that inherently has a short-circuit failure mode.

Failure of the crowbar switch may be caused by failure of one or more components of the secondary switching block, which prevents switching of the crowbar switch to its on-state, and a rise in voltage across the crowbar switch that exceeds a safe voltage level. Nonetheless, even though failure of one or more components of the secondary switching block prevents switching of the crowbar switch to its on-state to conduct current, the short-circuit failure mode of the crowbar switch ensures that the crowbar switch is still able to provide an alternative, safe current path in the form of a short-circuit for any current flowing through the switching device, thus allowing the switching device to safely conduct current.

The inclusion of the crowbar circuit in the switching device therefore provides the switching device with the capability to selectively form a protective current bypass path so as to allow any current flowing through the switching device to bypass the primary switching block, if necessary. This ensures that no single component fault can lead to a situation in which there is no safe current path through the switching device, thus improving the reliability of the switching device.

In addition the configuration of the crowbar circuit as set out above is advantageous in that it allows the crowbar circuit to rapidly and reliably respond to an event of failure of the switching control unit and/or one or more semiconductor switches. This is because occurrence of the failure event causes the switching control unit to automatically stop generating the control signal, and also because detection of the failure event might not be required to cause the switching control unit to stop generating the control signal. This thereby allows rapid and reliable turn-off of the switching element, in response to the failure event, to switch the crowbar switch to its on-state in order to form the protective current bypass path.

In contrast, a crowbar circuit that relies on generation of a control signal, following the failure event, to trigger a crowbar would require the steps of detecting the failure event and then generating the control signal, which in turn would slow down the response of the crowbar circuit to the failure event. Moreover, such a crowbar circuit would not only require additional circuitry to carry out the steps of detecting the failure event and generating the control signal, but also require the additional circuitry to be continuously operational in order to avoid a risk of the failure event not being detected and/or the control signal not being generated. The inclusion of such additional circuitry would add to the size, weight and cost of the switching device, as well as adversely affect the performance and reliability of the crowbar circuit.

In embodiments of the invention, the secondary switching block may further include a resistive element connected in series with the switching element in the secondary switching block, a junction between the resistive element and the switching element is connected to the control electrode of the crowbar switch, and the resistive element is connected across the control electrode and an anode of the crowbar switch, wherein an impedance of the resistive element is variable to selectively modify current flow in the secondary switching block.

Preferably the resistive element has a non-linear voltage-current characteristic. Such a resistive element may include, but is not limited to, a varistor (e.g. a zinc-oxide varistor or a silicon carbide varistor), a Zener diode, a spark gap or a breakover diode.

The use of a resistive element with a variable impedance allows the secondary switching block to present a high impedance to current flowing in the secondary switching block when a voltage across the resistive element is lower than a predefined trigger voltage, and present a low impedance to current flowing in the secondary switching block when the voltage across the resistive element exceeds that predefined trigger voltage. For example, when the resistive element is a Zener diode, the Zener diode blocks current from flowing in the secondary switching block when a voltage across the Zener diode is lower than its breakdown voltage, and allows current to flow in the secondary switching block when the voltage across the Zener diode exceeds its breakdown voltage.

The inclusion of the resistive element in the secondary switching block ensures that the crowbar switch can be switched to its on-state only when the voltage across the primary switching block is sufficiently high to cause the voltage across the resistive element to exceed its trigger voltage and thereby allow current to flow in the secondary switching block.

The switching device according to the first aspect of the invention may form part of a circuit interruption device that comprises a main branch, an auxiliary branch, and first and second terminals for connection, in use, to an electrical network, wherein the main and auxiliary branches extend between the first and second terminals.

In such a circuit interruption device, the main branch may include a switching apparatus switchable to selectively allow current to flow in the main branch in a normal mode of operation or commutate current from the main branch to the auxiliary branch in a fault mode of operation, and the auxiliary branch may include the switching device according to the first aspect of the invention. Such a circuit interruption device may further include at least one extinguishing block, the or each extinguishing block including a resistor element and/or an arrester element to absorb and dissipate energy in the second mode of operation.

Optionally the switching device may further include an extinguishing block, wherein the extinguishing block includes a resistor element and/or an arrester element to absorb and dissipate energy, wherein the switching control unit controls the switching of the or each semiconductor switch to selectively commutate current from the primary switching block to the extinguishing block.

In a normal mode of operation of the circuit interruption device, the switching apparatus is closed, and current from the electrical network flows in the main branch. Meanwhile the or each semiconductor switch of the switching device is turned off, little to no current flows through the auxiliary branch and little to no voltage appears across the auxiliary branch.

A fault or other abnormal operating condition in the DC network may lead to high fault current flowing through the DC network.

Thereafter, the circuit interruption device may undergo a fault clearing operation, a re-closing operation and a re-closing onto a fault which has not successfully cleared. Operation of the first circuit interruption device during the fault clearing operation, the re-closing operation and the re-closing onto a fault which has not successfully cleared requires conduction of current in the auxiliary branch. As such, it is important for the auxiliary branch, and therefore the switching device, to be able to safely conduct current to ensure smooth and reliable operation of the circuit interruption device.

Occurrence of a fault in the electrical network may damage the auxiliary branch if failure of the switching control unit and/or one or more semiconductor switches adversely affects the ability of the switching device to safely conduct current. The inclusion of the crowbar circuit in the switching device however enables formation of a protective current bypass path through which the fault current can flow and thereby bypass the or each switching module of the switching device, thus allowing the switching device to safely conduct the fault current.

The use of the switching device according to the first aspect of the invention therefore results in a circuit interruption device with improved reliability.

In further embodiments of the invention the switching device may further include a snubber circuit, wherein the snubber circuit includes an energy storage device, and the extinguishing block is connected across the energy storage device.

The snubber circuit not only provides the switching device with a snubbing capability, but also may be used as a self-powering power supply circuit to supply power in order to drive the switching control unit and thereby enable switching of the or each semiconductor switch.

When the snubber circuit is used to supply power in order to drive the switching control unit, the resistive element of the secondary switching block may be selected to have a trigger voltage corresponding to a voltage across the primary switching block that is higher than is required to sufficiently charge the energy storage device to supply power in order to drive the switching control unit.

In such embodiments, the snubber circuit may further include:
  a passive current check element connected in series with the energy storage limb; and
  a resistor element connected across the passive current check element.

The passive current check element is a device that limits current flow to only one direction, and may be in the form of, for example, a single diode or a plurality of diodes. Similarly the resistor element may include a single resistor or a plurality of resistors.

In further embodiments of the invention, the primary switching block may include a plurality of parallel-connected switching modules and/or at least one switching module includes a plurality of parallel-connected switching sub-modules, each switching sub-module including one or more semiconductor switches.

The number of parallel-connected switching modules and/or switching sub-modules in the primary switching block may vary depending on the current and voltage requirements of the primary switching block and/or the need for one or more redundant switching modules and/or switching sub-modules so as to improve the reliability of the switching device.

At least one switching module may include a plurality of parallel-connected switching sub-modules packaged inside a housing, wherein the housing includes a plurality of pairs of terminals, and each pair of terminals is electrically connected across a respective one of the parallel-connected switching sub-modules. The configuration of a switching module in this manner provides the option of measuring current in either the switching module or each of its parallel-connected switching sub-modules.

In still further embodiments of the invention the switching device may further include at least one current sensor to measure a current in the or each switching module and/or the or each switching sub-module, the switching control unit being in communication with the or each current sensor to receive, in use, current measurement information from the or each current sensor, wherein the switching control unit does not generate the control signal when one or more switching modules and/or switching sub-module has a current therein that falls outside a predetermined current range.

The use of the or each current sensor and the switching control unit in the switching device in this manner enables formation of the protective current bypass path to reduce exposure of the primary switching block to a current flowing through the switching device when the current is too high to be safely conducted and/or cleared. More particularly, in response to detection of a current flowing in the switching device that is too high to be safely conducted and/or cleared, the switching control unit may stop generating the control signal in order to allow formation of the protective current bypass path. This allows the current flowing in the switching device to be divided between the crowbar switch and the primary switching block, thus allowing the switching device to safely conduct the current. Under such circumstances, when the switching device forms part of a circuit interruption device as set out above, the circuit interruption device is no longer capable of interrupting current, but the formation of the protective current bypass path prevents permanent damage to the circuit interruption device.

The switching control unit may be configured to enable detection of failure or impending failure of one or more switching modules and/or one or more switching sub-modules, such that detection of failure or impending failure of one or more switching modules and/or switching sub-modules causes the switching control unit to automatically stop generating the control signal, for example, as follows.

Failure of a switching module or switching sub-module is defined as a state of that switching module or switching sub-module that does not allow that switching module or switching sub-module to function properly, e.g. an open-circuit failure of a switching module or switching sub-module.

In embodiments of the invention employing the use of at least one current sensor, a current in the or each switching module and/or the or each switching sub-module that falls outside the predetermined current range may correspond to failure or impending failure of one or more switching modules and/or one or more switching sub-modules.

Failure or impending failure of a switching module will result in that switching module carrying less current than the or each other switching module of the primary switching block. As such, failure or impending failure of a switching module may be detected through measurement of the current in that switching module being less than the current in the or each other switching module, or measurement of the current in the or each other switching module reaching an unsafe level.

Similarly failure or impending failure of a switching sub-module will result in that switching sub-module carrying less current than the or each other switching sub-module of the switching module. As such, failure or impending failure of a switching sub-module may be detected through measurement of the current in that switching sub-module being less than the current in the or each other switching sub-module, or measurement of the current in the or each other switching sub-module reaching an unsafe level.

This allows detection of failure or impending failure of one or more switching modules or switching sub-modules from a plurality of switching modules and/or switching sub-modules. In addition, the ability of a current sensor to detect impending failure of a switching module or switching sub-module enables the crowbar circuit to form the protective current bypass path before that switching module or switching sub-module fails.

The or each current sensor may be any device that is capable of directly measuring a magnitude of current, or directly measuring a rate of change in current in order to determine a magnitude of current. For example, the or each current sensor may include a resistive shunt, an inductor, a current transformer and/or a Rogowski coil, the or each current sensor being connected in series with the or each switching module and/or the or each switching sub-module.

When the switching device forms part of a circuit interruption device as set out above, the auxiliary branch, and therefore the switching device, is only required to operate infrequently. This in turn means that the or each current sensor is also only required to operate infrequently. As such, the use of the or each current sensor in the switching device can be cost-effective.

In embodiments of the invention, the switching device may further include at least one voltage sensor to measure a voltage across the or each switching module, the switching control unit being in communication with the or each voltage sensor to receive, in use, voltage measurement information from the or each voltage sensor, wherein the switching control unit does not generate the control signal when one or more switching modules has a voltage thereacross that matches or exceeds a predetermined voltage threshold, and the predetermined voltage threshold corresponds to failure of the or each switching module.

The use of at least one voltage sensor in the switching device permits detection of open-circuit failure of a switching module. For example, when a switching module is commanded to turn on, open-circuit failure of the switching module is detected if a voltage across the switching module exceeds a predefined voltage threshold.

According to a second aspect of the invention, there is provided a circuit interruption device comprising:
 a main branch;
 an auxiliary branch and
 first and second terminals for connection, in use, to an electrical network, wherein the main and auxiliary branches extend between the first and second terminals,
 wherein the main branch includes a switching apparatus switchable to selectively allow current to flow in the main branch in a first mode of operation or commutate current from the main block to the auxiliary branch in a second mode of operation,
 the circuit interruption device further includes at least one extinguishing block, the or each extinguishing block including a resistor element and/or an arrester element to absorb and dissipate energy in the second mode of operation, and
 the auxiliary branch includes at least one switching device according to any embodiment of the first aspect of the invention, wherein the primary switching block of the or each switching device includes at least one switching module, the or each switching module including at least one semiconductor switch switchable to selectively allow current to flow through that switching module in the second mode of operation or commutate current from that switching block to the or each corresponding extinguishing block in order to absorb and dissipate energy in the second mode of operation.

In use, the circuit interruption device according to the second aspect of the invention may be used as a DC circuit breaker.

The switching apparatus may, for example, include at least one mechanical switching element and/or at least one semiconductor switching element. The number of mechanical switching elements and/or semiconductor switching elements in the switching apparatus may vary depending on the voltage and switching requirements of the circuit interruption device.

The number of switching devices in the auxiliary branch may vary depending on the voltage requirements of the circuit interruption device.

Optionally at least one extinguishing block is connected across the auxiliary branch.

The circuit interruption device may further include a plurality of passive current check elements connected in parallel with the auxiliary branch to define a full-bridge arrangement between the first and second terminals, in order to form a bidirectional configuration of the circuit interruption device.

According to a third aspect of the invention, there is provided a crowbar circuit for an electrical circuit, the crowbar circuit comprising:
 a crowbar switch switchable to selectively allow current to flow through the crowbar switch for bypassing the electrical circuit; and
 a secondary switching block including a switching element connected across a control electrode and a cathode of the crowbar switch, the switching element being switchable to selectively allow a non-zero voltage to be applied across the control electrode and cathode in order to either keep the crowbar switch in an off-state or switch the crowbar switch to an on-state,
 wherein the switching element is switched on in order to keep the crowbar switch in the off-state when the switching element receives, in use, a control signal, and the switching element is switched off in order to switch the crowbar switch to the on-state when the switching element does not receive, in use, a control signal, and the switching element is communicable with the electrical circuit to receive, in use, a control signal generated by the electrical circuit.

It will be appreciated that the use of the crowbar circuit to create a protective current bypass path may also be extended to electrical circuits other than a switching device forming part of a circuit interruption device.

In embodiments of the third aspect of the invention, the secondary switching block may further include a resistive element connected in series with the switching element in the secondary switching block, a junction between the resistive element and the switching element is connected to the control electrode of the crowbar switch, and the resistive element is connected across the control electrode and an anode of the crowbar switch,
 wherein an impedance of the resistive element is variable to selectively modify current flow in the secondary switching block.

Figure 2:
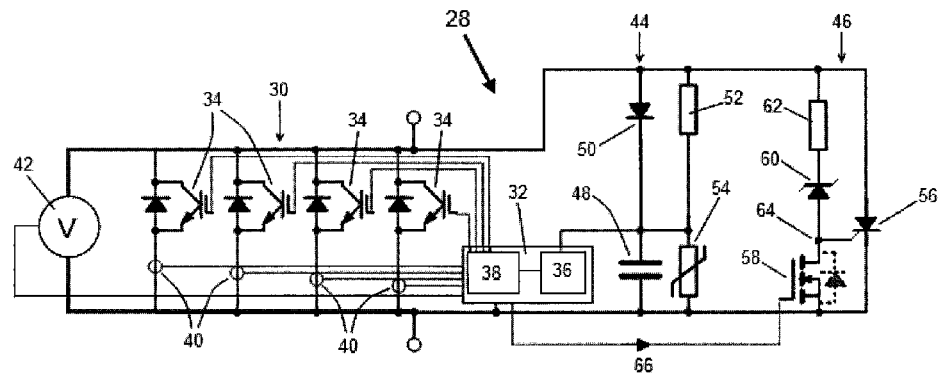
Figure 3:
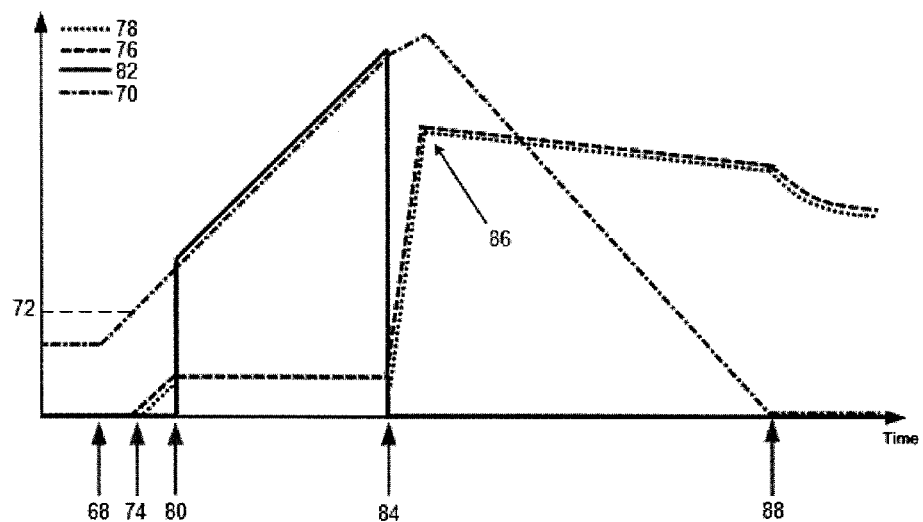
Figure 4:
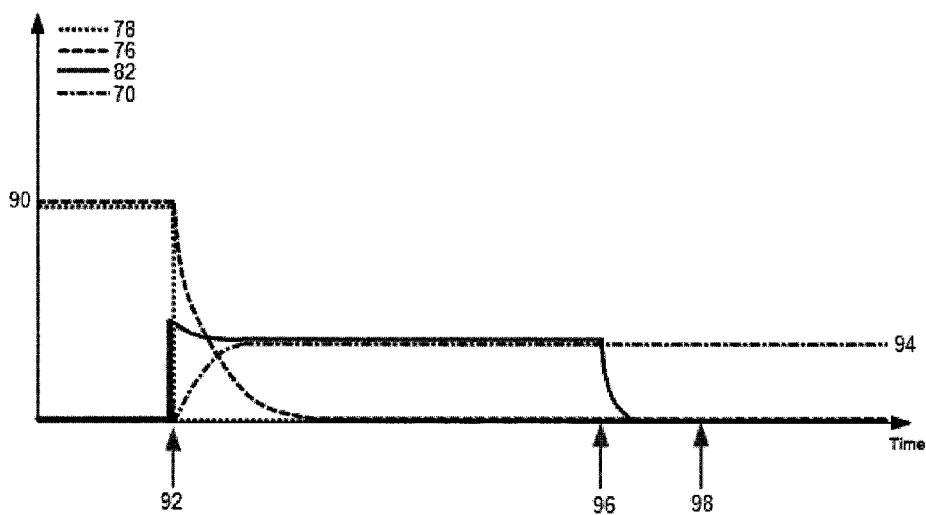
Figure 5:
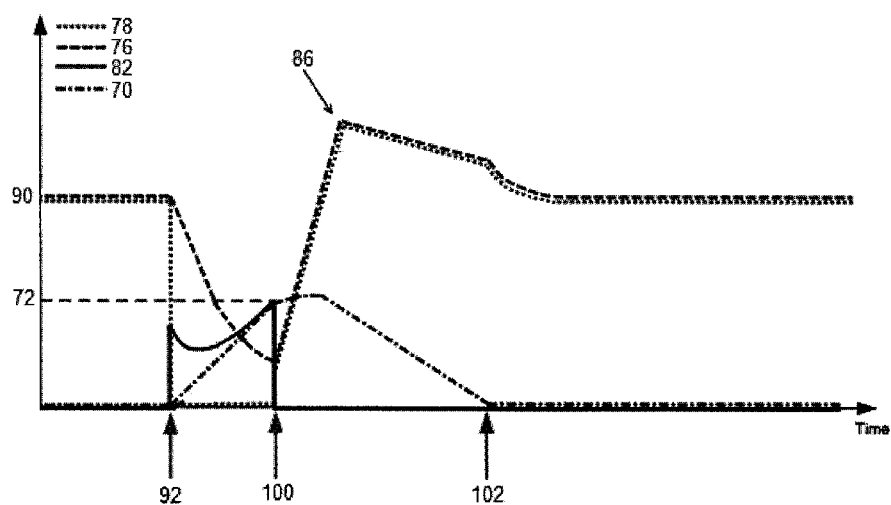
Figure 6:
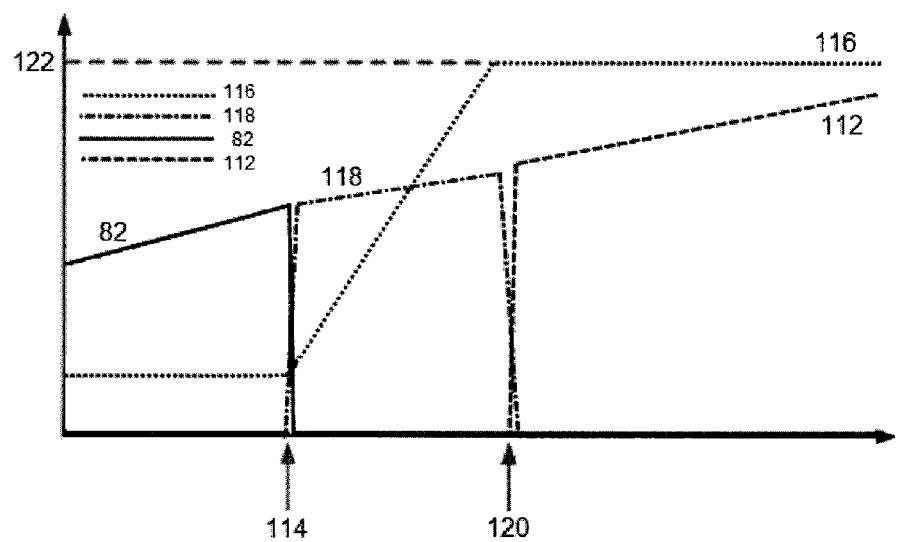
Figure 7:
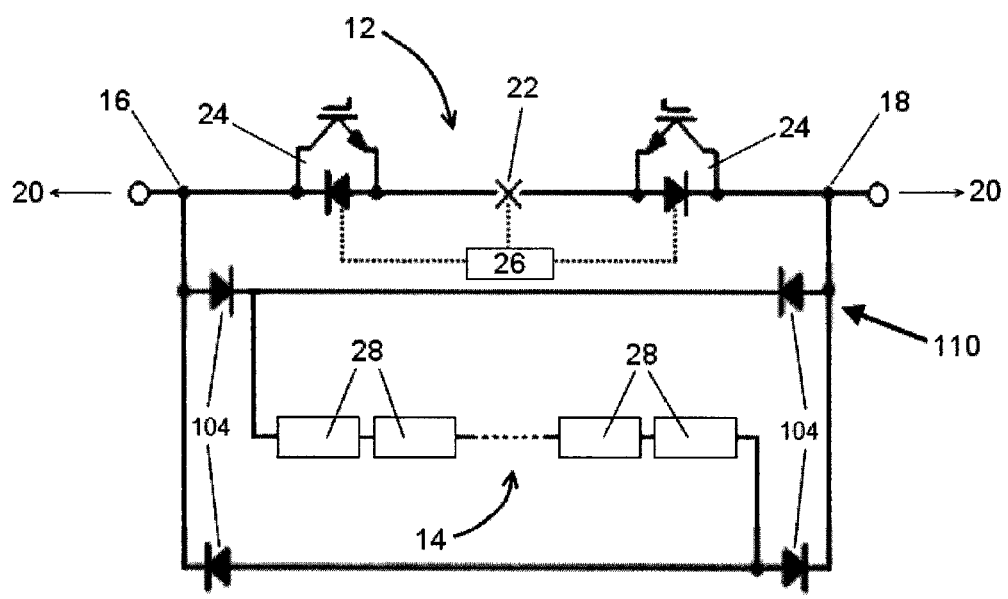

Preferred embodiments of the invention will now be described, by way of non-limiting examples, with reference to the accompanying drawings in which:
 FIG. 1 shows, in schematic form, a first circuit interruption device according to a first embodiment of the invention;
 FIG. 2 shows, in schematic form, a switching device forming part of the first circuit interruption device of FIG. 1;
 FIGS. 3 to 5 respectively illustrate the changes in voltage and current in the first circuit interruption device of FIG. 1 during a fault clearing operation, a re-closing operation and a re-closing onto a fault which has not successfully cleared;
 FIG. 6 illustrates the changes in voltage and current in a switching device of the auxiliary branch of the first circuit interruption device of FIG. 1 during operation of the crowbar circuit of the switching device; and
 FIG. 7 shows, in schematic form, a second circuit interruption device according to a second embodiment of the invention.

A first circuit interruption device 10 according to a first embodiment of the invention is shown in FIG. 1.

The first circuit interruption device 10 comprises a main branch 12, an auxiliary branch 14, and first and second terminals 16,18. Each of the main and auxiliary branches 12,14 extends between the first and second terminals 16,18.

In use, the first and second terminals 16,18 are connected to a DC electrical network 20.

The main branch 12 includes a switching apparatus in the form of a mechanical switching element 22, e.g. a vacuum interrupter switch, connected in series with a plurality of semiconductor switching elements in the form of main IGBTs 24. The first circuit interruption device 10 further includes a main switching control unit 26 to control the switching of the mechanical switching element 22 and the plurality of main IGBTs 24.

In other embodiments, it is envisaged that the number of mechanical switching elements 22 and main IGBTs 24 in the switching apparatus may vary depending on the voltage and switching requirements of the first circuit interruption device 10.

The auxiliary branch 14 is connected across the main branch 12, and includes a plurality of series-connected switching devices 28. In other embodiments, it is envisaged that the number of switching devices 28 in the auxiliary branch 14 may vary depending on the voltage requirements of the auxiliary branch 14.

FIG. 2 shows, in schematic form, the structure of each switching device 28.

Each switching device 28 includes a primary switching block 30 and an auxiliary switching control unit 32. The primary switching block 30 includes a plurality of parallel-connected switching modules, each of which includes a semiconductor switch in the form of an auxiliary IGBT 34. In other embodiments of the invention, one or more of the semiconductor switches of the primary switching block 30 may take the form of a gate turn-off thyristor (GTO), gate-commutated thyristor (GCT), integrated gate-commutated thyristor (IGCT), metal-oxide semiconductor field-effect transistor (MOSFET) or junction field-effect transistor (JFET).

It is envisaged that, in further embodiments of the invention, the number of parallel-connected switching modules in the primary switching block 30 may vary depending on the current requirements of the primary switching block 30.

It is also envisaged that, in still further embodiments of the invention, the plurality of parallel-connected switching modules may be replaced by a single switching module and/or the single semiconductor switch in each switching module may be replaced by a plurality of parallel-connected switching sub-modules, each switching sub-module including one or more semiconductor switches. The use of parallel-connected switching modules and/or switching sub-modules allows the switching device 28 to have one or more redundant switching modules and/or switching sub-modules so as to improve the reliability of the switching device 28.

The auxiliary switching control unit 32 includes a power supply unit 36 and control electronics 38 to control the switching of each auxiliary IGBT 34.

Each switching device 28 further includes a plurality of current sensors 40. Each current sensor 40 is in the form of a resistive shunt connected in series with the respective auxiliary IGBT 34. Use of the resistive shunts in this manner ensures current sharing between the parallel-connected auxiliary IGBTs 34.

In other embodiments of the invention, it is envisaged that each current sensor 40 may be replaced by a different type of current sensor that is capable of directly measuring a magnitude of current, or directly measuring a rate of change in current in order to determine a magnitude of current, e.g. an inductor, a current transformer or a Rogowski coil. Current sensors that directly measure a rate of change in current are suitable for measuring current in the switching device 28 because operation of the first circuit interruption device 10 involves interrupting a fault current with a relatively high rate of change in current.

Each switching device 28 further includes a voltage sensor 42 connected across the primary switching block 30.

The auxiliary switching control unit 32 is in communication with each current sensor 40 and the voltage sensor 42 to receive, in use, current measurement information from each current sensor 40 and voltage measurement information from the voltage sensor 42.

Each switching device 28 further includes a snubber circuit 44, an extinguishing block and a crowbar circuit 46.

The snubber circuit 44 is connected across the primary switching block 30. The snubber circuit 44 includes an energy storage device in the form of a capacitor 48 connected in series with a passive current check element in the form of a diode 50, and a first resistor 52 connected across the passive current check element. It is envisaged that, in other embodiments, the diode 50 may be replaced by another type of passive current check element that limits current flow to only one direction. It is also envisaged that, in other embodiments, the diode 50 may be replaced by a plurality of diodes and/or the first resistor 52 may be replaced by a plurality of first resistors.

A junction between the capacitor 48 and the diode 50 is connected to the power supply unit 36 of the auxiliary switching control unit 32. The capacitor 48 is rated to be capable of charging up to a voltage level needed to provide the driving voltage that is required to drive the auxiliary switching control unit 32, i.e. power the power supply unit 36 to enable the control electronics 38 to control the switching of each auxiliary IGBT 34. Thus, the snubber circuit 44 not only provides the switching device 28 with a snubbing capability, but also may be used as a self-powering power supply circuit to supply power in order to drive the auxiliary switching control unit 32 and thereby enable switching of the auxiliary IGBTs 34.

In other embodiments, power may be supplied to the power supply unit 36 of the auxiliary switching control unit 32 by installing a separate power source in each switching device 28 or supplying power from ground potential to each auxiliary switching control unit 32.

The extinguishing block is connected across the capacitor 48 of the snubber circuit 44. The extinguishing block includes a surge arrester 54 to absorb and dissipate energy, wherein the switching control unit controls the switching of the auxiliary IGBTs 34 to selectively commutate current from the primary switching block 30 to the extinguishing block.

It is envisaged that, in other embodiments of the invention, the snubber circuit 44 may be omitted and the extinguishing block may be connected directly across the switching device 28.

Optionally, in addition to or instead of the aforementioned extinguishing block in each switching device 28, the first circuit interruption device 10 may include an extinguishing block connected across the auxiliary branch 14.

The crowbar circuit 46 is connected across the primary switching block 30. The crowbar circuit 46 includes a crowbar switch in the form of a thyristor 56, and further includes a secondary switching block.

The secondary switching block includes a switching element in the form of an enhancement-mode MOSFET 58, and a resistive element in the form of a Zener diode 60 and a second resistor 62 connected in series. The resistive element is connected in series with the MOSFET 58. A junction 64 between the resistive element and the MOSFET 58 is connected to the gate (i.e. control electrode) of the thyristor 56, the MOSFET 58 is connected across a gate and cathode of the thyristor 56, and the resistive element is connected across the gate and an anode of the thyristor 56.

It is envisaged that, in other embodiments of the invention, the resistive element may omit the second resistor 62 such that the resistive element consists of only the Zener diode 60.

The MOSFET 58 is in communication with the auxiliary switching control unit 32 to receive, in use, a control signal 66 generated by the auxiliary switching control unit 32. In use, the MOSFET 58 is switched on when the MOSFET 58 receives a control signal 66, and the MOSFET 58 is switched off when the MOSFET 58 does not receive a control signal 66.

The position of the Zener diode 60 relative to the direction of current flowing through the switching device 28 is set such that the Zener diode 60 blocks current from flowing in the secondary switching block when a voltage across the Zener diode 60 is lower than its breakdown voltage, and allows current to flow in the secondary switching block when the voltage across the Zener diode 60 exceeds its breakdown voltage.

It is envisaged that, in other embodiments of the invention, the thyristor 56 may be replaced by a different type of solid-state switch such as a GTO, GCT or IGCT, or by a gas discharge switch such as a thyratron or a triggered spark gap, the enhancement MOSFET 58 may be replaced by a different type of switching element, such as a bipolar transistor, an enhancement-mode JFET or an IGBT, and/or the Zener diode 60 may be replaced by another type of resistive element with a variable impedance, such as a varistor, a breakover diode, a spark gap or another type of resistive element with a non-linear voltage-current characteristic.

Operation of the first circuit interruption device 10 in FIG. 1 in respect of the DC electrical network 20 is described as follows, with reference to FIGS. 1 to 5.

During normal operation of the DC network 20, the switching apparatus is closed and current from the DC network 20 flows in the main branch 12 in a normal mode of operation of the first circuit interruption device 10. Meanwhile each auxiliary IGBT 34 of each switching device 28 is turned off, little to no current flows through the auxiliary branch 14 and little to no voltage appears across the auxiliary branch 14.

FIG. 3 illustrates the changes in voltage 76,78 and current 70,82 in the first circuit interruption device 10 during a fault clearing operation.

A fault or other abnormal operating condition in the DC network 20 may lead to high fault current flowing through the DC network 20. Occurrence 68 of the fault may be detected by the current 70 in the first circuit interruption device 10 reaching a current trip threshold 72.

In response to detection of the fault in the DC network 20, the main switching control unit 26 controls the switching of the switching apparatus to open 74 in order to commutate current from the main branch 12 to the auxiliary branch 14 in a fault mode of operation of the first circuit interruption device 10. Initially, after the switching apparatus is opened, the fault current does not fully commutate from the main branch 12 to the auxiliary branch 14. Instead the auxiliary branch 14 sees a current pulse, which results in voltages 76, 78 being applied across the capacitor 48 and each auxiliary IGBT 34.

After the capacitor 48 has had sufficient time to charge up to the voltage level needed to provide the required driving voltage, the snubber circuit 44 provides the driving voltage to the power supply unit 36 of the auxiliary switching control unit 32. Each auxiliary IGBT 34 is then turned on 80 to allow current 82 to flow in each auxiliary IGBT 34, and thereby allow the fault current to be fully commutated from the main branch 12 to the auxiliary branch 14. This results in the voltage 78 across each auxiliary IGBT 34 dropping to zero.

After a predetermined period of time, typically at least hundreds of μs, each auxiliary switching control unit 32 controls the switching of the corresponding auxiliary IGBTs 34 to turn off 84 to commutate the fault current from the primary switching block 30 to the extinguishing block. Meanwhile, in each switching device 28, the capacitor 48 will have enough available stored energy to allow the snubber circuit 44 to provide the driving voltage to the power supply unit 36 of the auxiliary switching control unit 32 to turn off the auxiliary IGBTs 34.

At this stage the voltage across the auxiliary branch 14 is sufficiently high to permit current to flow through each surge arrester 54. This allows the surge arresters 54 to absorb and dissipate inductive energy from the DC network 20 so as to limit both a maximum voltage 86 and a rate of rise of voltage across each switching device 28 and thereby limit both a maximum voltage and a rate of rise of voltage across the first circuit interruption device 10. Meanwhile the current 70 in the first circuit interruption device 10 decreases until it reaches zero 88. In this manner the first circuit interruption device 10 undergoes a fault clearing operation to clear a fault in the DC electrical network 20.

FIG. 4 illustrates the changes in voltage 76,78 and current 70,82 in the first circuit interruption device 10 during a re-closing operation.

Following fault clearance, following fault clearance, voltages 76,78 are present across the capacitor 48 and each auxiliary IGBT 34, and the value 90 of these voltages 76,78 is determined by the corresponding surge arrester 54.

To initiate re-closing of the first circuit interruption device 10, each auxiliary switching control unit 32 controls the switching of the corresponding auxiliary IGBTs 34 to turn on 92 so as to allow current 82 to flow in each auxiliary IGBT 34. At this stage, the voltage 78 across each auxiliary IGBT 34 falls rapidly to zero, while the voltage 76 across the capacitor 48 gradually reduces to zero. The switching apparatus of the main branch 12 remains open.

Meanwhile the current 70 flowing in the first circuit interruption device 10 increases from zero towards a current level 94 that corresponds to the current from the electrical network 20 flowing in the main branch 12 in the normal, mode of operation of the first circuit interruption device 10.

After a predetermined re-closing time, the main switching control unit 26 turns on 96 the main IGBTs 24, and then turns on 96 the mechanical switching element 22, i.e. the main switching control unit 26 turns on the main branch 12. Since the on-state impedance of the main branch 12 is much lower than that of the auxiliary branch 14, the action of turning on the main branch 12 causes most of the current to commutate from the auxiliary branch 14 to the main branch 12. This is shortly followed by each auxiliary switching control unit 32 controlling the switching of the corresponding auxiliary IGBTs 34 to turn off 98 so as to stop conducting current and thus cause any residual current in the auxiliary branch 14 to commutate to the main branch 12. In this manner the first circuit interruption device 10 undergoes a re-closing operation to resume normal operation after fault clearance.

FIG. 5 illustrates the changes in voltage and current in the first circuit interruption device 10 when the auxiliary branch 14 re-closes onto a fault which has not successfully cleared.

As mentioned above, following fault clearance, voltages 76,78 are present across the capacitor 48 and each auxiliary IGBT 34, and the value 90 of these voltages 76,78 is determined by the corresponding surge arrester 54.

To initiate re-closing of the first circuit interruption device 10, each auxiliary switching control unit 32 controls the switching of the corresponding auxiliary IGBTs 34 to turn on 92 so as to allow current 82 to flow in each auxiliary IGBT 34. At this stage, the voltage 78 across each auxiliary IGBT 34 falls rapidly to zero, while the voltage 76 across the capacitor 48 gradually reduces. The switching apparatus of the main branch 12 remains open.

Meanwhile the currents 82,70 flowing in each auxiliary IGBT 34 and the first circuit interruption device 10 increases. However, if a fault is still present in the DC network 20, these currents 82,70 continue to increase until they reach the current trip threshold 72. This prompts each auxiliary switching control unit 32 to control the switching of the corresponding auxiliary IGBTs 34 to turn off 100 so as to commutate the current from the primary switching block 30 to the extinguishing block.

In contrast to the operation of the first circuit interruption device 10 during a fault clearing operation, the mechanical switching element 22 is initially open when the auxiliary branch 14 re-closes onto a fault which has not successfully cleared. This means that there is no need to wait for the mechanical switching element 22 to open. Consequently the auxiliary IGBTs 34 can be turned off as soon as the current trip threshold 72 is reached, resulting in faster fault clearing and a lower peak fault current.

The surge arresters 54 then absorb and dissipate inductive energy from the DC network 20 so as to limit both a maximum voltage 86 and a rate of rise of voltage across each switching device 28 and thereby limit both a maximum voltage and a rate of rise of voltage across the first circuit interruption device 10. Meanwhile the current 70 in the first circuit interruption device 10 decreases until it reaches zero 102. In this manner the first circuit interruption device 10 interrupts the fault current caused by re-closing onto a fault.

Operation of the first circuit interruption device 10 during a fault clearing operation, a re-closing operation and a re-closing onto a fault operation therefore requires conduction of current in the auxiliary branch 14. As such, it is important for the auxiliary branch 14 to be able to safely conduct current to ensure smooth and reliable operation of the first circuit interruption device 10.

To ensure that the auxiliary branch 14 is able to safely conduct current, the crowbar circuit 46 of each switching device 28 is operated as follows, with reference to FIG. 6.

As mentioned above, in each switching device 28, the auxiliary switching control unit 32 controls the switching of each auxiliary IGBT 34 to turn on or off to control the flow of current through the primary switching block 30. When each auxiliary IGBT 34 and the auxiliary switching control unit 32 of the primary switching block 30 is operating within predefined operating parameters, i.e. they are functioning normally, the auxiliary switching control unit 32 generates a control signal 66 and sends the control signal 66 to the MOSFET 58. The auxiliary switching control unit 32 continuously generates the control signal 66 and sends the control signal 66 to the MOSFET 58 as long as each auxiliary IGBT 34 and the auxiliary switching control unit 32 of the primary switching block 30 are operating within the predefined operating parameters.

On receipt of the control signal 66 from the auxiliary switching control unit 32, the MOSFET 58 is switched on, i.e. it is closed, or stays switched on if it is already switched on. This results in connection of the gate and cathode of the thyristor 56, via the closed MOSFET 58. This means that a non-zero voltage cannot be applied across the gate and cathode of the thyristor 56 in order to switch the thyristor 56 to its on-state. As such, the thyristor 56 is kept in its off-state and does not conduct any current 112.

In the event of failure of the auxiliary switching control unit 32, each auxiliary IGBT 34 cannot be controlled to turn on to allow current to flow through the switching device 28. This could adversely affect the ability of the switching device 28 to safely conduct current. Similarly, in the event of failure of one or more auxiliary IGBTs 34, the inability to turn on the or each failed auxiliary IGBT 34 could also adversely affect the ability of the switching device 28 to safely conduct current. This might damage the auxiliary branch 14, particularly during occurrence of the fault in the electrical network 20.

The inclusion of the current sensors 40 and voltage sensor 42 in each switching device 28 permits detection of failure or impending failure of one or more auxiliary IGBTs 34 by measuring the current 82 in each auxiliary IGBT 34 and the voltage across the primary switching block 30. For example, when an auxiliary IGBT 34 is commanded to turn on, open-circuit failure of the auxiliary IGBT 34 is detected if a voltage across the auxiliary IGBT 34 matches or exceeds a predefined voltage threshold. Also, for example, failure or impending failure of an auxiliary IGBT 34 is detected if a current in that auxiliary IGBT 34 falls outside a predetermined current range. This method of detecting failure or impending failure of an auxiliary IGBT 34 is possible because failure or impending failure of the auxiliary IGBT 34 will result in that auxiliary IGBT 34 carrying less current than the other auxiliary IGBTs 34, and so failure or impending failure of that auxiliary IGBT 34 may be detected through measurement of the current in that auxiliary IGBT 34 being less than the current in each other auxiliary IGBT 34, or measurement of the current in each other auxiliary IGBT 34 reaching an unsafe level. Failure of an auxiliary IGBT 34 is defined as a state of the auxiliary IGBT 34 that does not allow the auxiliary IGBT 34 to function properly, e.g. an open-circuit failure of the auxiliary IGBT 34.

It will be appreciated that, in embodiments where a switching module includes a plurality of parallel-connected switching sub-modules and each switching sub-module includes one or more semiconductor switches, failure of the switching module may be defined as a state of the switching module that does not allow the switching module to function properly, e.g. an open-circuit failure of the switching module or some of its switching sub-modules.

When one or more auxiliary IGBTs 34 has a current 82 therein that falls outside a predetermined current range and thereby corresponds to failure or impending failure of that auxiliary IGBT 34, the switching control unit stops generating 114 the control signal 66 and switches off each auxiliary IGBT 34. This in turn causes each auxiliary IGBT 34 to stop conducting current 82 and results in the current 118 transferring to the snubber circuit 44, causing the voltage 116 across the capacitor 48 of the snubber circuit 44 to rise rapidly.

When one or more auxiliary IGBTs 34 has a voltage thereacross that matches or exceeds a predetermined voltage threshold that corresponds to open-circuit failure of that auxiliary IGBT 34, the switching control unit also stops generating 114 the control signal 66 and switches off each auxiliary IGBT 34. This in turn causes each auxiliary IGBT 34 to stop conducting current 82 and results in the current 118 transferring to the snubber circuit 44, causing the voltage 116 across the capacitor 48 of the snubber circuit 44 to rise rapidly.

Failure of the auxiliary switching control unit 32, i.e. failure of its power supply unit 36 and/or control electronics 38, causes the auxiliary switching control unit 32 to automatically stop generating 114 the control signal 66 and switches off each auxiliary IGBT 34. This in turn causes each auxiliary IGBT 34 to stop conducting current 82 and results in the current 118 transferring to the snubber circuit 44, causing the voltage 116 across the capacitor 48 of the snubber circuit 44 to rise rapidly.

Following failure of the auxiliary switching control unit 32 and/or one or more auxiliary IGBTs 34, the MOSFET 58 stops receiving the control signal 66 from the auxiliary switching control unit 32, and the MOSFET 58 is switched off, i.e. it is opened. The open state of the MOSFET 58 results in disconnection of the gate and cathode of the thyristor 56. This means that a non-zero voltage can be applied across the gate and cathode of the thyristor 56 in order to switch the thyristor 56 to its on-state, so that the thyristor 56 may conduct current 112.

If the voltage across the primary switching block 30 is not sufficiently high to cause the voltage across the Zener diode 60 to exceed its breakdown voltage 122, current does not flow in the secondary switching block. This means that the thyristor 56 cannot be switched to its on-state even when the MOSFET 58 is switched off. If the voltage across the primary switching block 30 is sufficiently high to cause the voltage across the Zener diode 60 to exceed its breakdown voltage 122, current can flow in the secondary switching block. This means that a non-zero voltage can then be applied across the gate and cathode of the thyristor 56, which in turn can be switched to its on-state.

The Zener diode 60 may be selected to have a breakdown voltage 122 corresponding to a voltage across the primary switching block 30 that is higher than is required to sufficiently charge the capacitor 48 to supply power to the power supply unit 36 of the auxiliary switching control unit 32.

Therefore, the thyristor 56 is switched 120 to its on-state only when the MOSFET 58 is switched off and the voltage across the primary switching block 30 is sufficiently high to cause the voltage across the Zener diode 60 to exceed its breakdown voltage 122.

The thyristor 56 in its on-state is capable of conducting current 112. Hence, by virtue of the crowbar circuit 46 being connected across the primary switching block 30, the thyristor 56 in its on-state forms a protective current bypass path through which current can flow in order to bypass the primary switching block 30. In this manner the thyristor 56 provides an alternative, safe current path for any current flowing through the switching device 28. This allows each switching device 28, and therefore the auxiliary branch 14, to safely conduct current, even when the primary switching block 30 is unable to safely conduct current due to failure of the auxiliary switching control unit 32 and/or one or more auxiliary IGBTs 34. This in turn inhibits any further rise in the voltage 116 across the capacitor 48 of the snubber circuit 44, and hence across each auxiliary IGBT 34 in order to maintain that voltage 116 below or at an overvoltage protective setting corresponding to the breakdown voltage 122 of the Zener diode 60.

Preferably the thyristor 56 of each switching device 28 has a short-circuit failure mode in which, upon failure of the thyristor 56, the failed thyristor 56 forms a short circuit that permits, in use, current to pass through the thyristor 56. For example, the thyristor 56 may be a pressure-bonded thyristor that inherently has a short-circuit failure mode.

Failure of the thyristor 56 may be caused by failure of the resistive element and/or MOSFET 58 of the secondary switching block, which prevents switching of the thyristor 56 to its on-state, and a rise in voltage across the thyristor 56 that exceeds a safe voltage level. Nonetheless, even though the resistive element and/or MOSFET 58 of the secondary switching block prevents switching of the thyristor 56 to its on-state to conduct current, the short-circuit failure mode of the thyristor 56 ensures that the thyristor 56 is still able to provide an alternative, safe current path in the form of a short-circuit for any current flowing through the corresponding switching device 28, thus allowing that switching device 28 to safely conduct current.

The inclusion of the crowbar circuit 46 in each switching device 28 therefore provides each switching device 28 with the capability to selectively form a protective current bypass path so as to allow any current flowing through that switching device 28 to bypass the corresponding primary switching block 30, if necessary. This ensures that no single component fault can lead to a situation in which there is no safe current path through the switching device 28, thus improving the reliability of the switching device 28 and therefore the first circuit interruption device 10.

Furthermore, under circumstances in which the current flowing through the first circuit interruption device 10 is too high to be safely conducted and/or cleared, each auxiliary switching control unit 32 may stop generating the control signal 66 as soon as this high current is detected. This enables formation of the protective current bypass path in order to allow this current to be divided between the thyristor 56 and the auxiliary IGBTs 34, thus allowing each switching device 28 and the auxiliary branch 14 to safely conduct the high current. Under such circumstances the first circuit interruption device 10 is no longer capable of interrupting current, but the formation of the protective current bypass path prevents permanent damage to the first circuit interruption device 10.

In addition the configuration of the crowbar circuit 46 as set out above is advantageous in that it allows the crowbar circuit 46 to rapidly and reliably respond to an event of failure of the auxiliary switching control unit 32 and/or one or more auxiliary IGBTs 34. This is because occurrence of the failure event causes the auxiliary switching control unit 32 to automatically stop generating the control signal 66, and also because detection of the failure event might not be required to cause the auxiliary switching control unit 32 to stop generating the control signal 66. This thereby allows rapid and reliable turn-off of the MOSFET 58, in response to the failure event, to switch the thyristor 56 to its on-state in order to form the protective current bypass path.

In contrast, an alternative crowbar circuit that relies on generation of a control signal, following the failure event, to trigger a crowbar would require the steps of detecting the failure event and then generating the control signal, which in turn would slow down the response of the crowbar circuit to the failure event. Moreover, such an alternative crowbar circuit would not only require additional circuitry to carry out the steps of detecting the failure event and generating the control signal, but also require the additional circuitry to be continuously operational in order to avoid a risk of the failure event not being detected and/or the control signal not being generated. The inclusion of such additional circuitry would add to the size, weight and cost of the switching device 28, as well as adversely affect the performance and reliability of the crowbar circuit.

The effectiveness of the crowbar circuit 46 shown in FIG. 2 is enhanced by the inclusion of the current sensors 40 and voltage sensor 42 in the switching device 28. This is because, as set out above, the inclusion of the current sensors 40 and the voltage sensor 42 in each switching device 28 allows detection of failure or impending failure of one or more auxiliary IGBTs 34. Omission of the current sensors 40 and voltage sensor 42 in the switching device 28 would otherwise only allow the crowbar circuit 46 to form the protective current bypass path in response to failure of the auxiliary switching control unit 32.

In addition, the ability of each current sensor 40 to detect impending failure of an auxiliary IGBTs 34 enables the crowbar circuit 46 to form the protective current bypass path before that auxiliary IGBT 34 fails.

Furthermore, during operation of the first circuit interruption device 10, the auxiliary branch 14, and therefore each switching device 28, is only required to operate infrequently. This in turn means that each current sensor 40 is also only required to operate infrequently. As such, the use of the current sensors 40 in each switching device 28 can be cost-effective.

A second circuit interruption device 110 according to a second embodiment of the invention is shown in FIG. 7. The second circuit interruption device 110 of FIG. 7 is similar in structure and operation to the first circuit interruption device 10 of FIG. 1, and like features share the same reference numerals.

The second circuit interruption device 110 differs from the first circuit interruption device 10 in that the second circuit interruption device 110 further includes a plurality of passive current check elements 104 connected in parallel with the auxiliary branch 14 to define a full-bridge arrangement between the first and second terminals 16,18.

The configuration of the second circuit interruption device 110 in this manner results in a circuit interruption device with bidirectional current interruption capabilities, i.e. it is capable to operate in both directions of current between the first and second terminals 16,18 of the circuit interruption device.

In other embodiments, it is envisaged that the number of passive current check elements 104 connected in parallel with the auxiliary branch 14 to define a full-bridge arrangement between the first and second terminals 16,18 may vary depending on the voltage requirements of the first circuit interruption device 10.

The invention claimed is:

1. A crowbar circuit for an electrical circuit, the crowbar circuit comprising a crowbar switch switchable to selectively allow current to flow through the crowbar switch for bypassing the electrical circuit, wherein the crowbar circuit further includes:
   a secondary switching block including a switching element connected across a control electrode and a cathode of the crowbar switch, the switching element being switchable to selectively allow a non-zero voltage to be applied across the control electrode and cathode in order to either keep the crowbar switch in an off-state or switch the crowbar switch to an on-state,
   wherein the switching element is switched on in order to keep the crowbar switch in the off-state when the switching element receives, in use, a control signal, and the switching element is switched off in order to switch the crowbar switch to the on-state when the switching element does not receive, in use, a control signal,
   wherein the switching element is communicable with the electrical circuit to receive, in use, a control signal generated by the electrical circuit; and
   wherein the crowbar switch has a short-circuit failure mode in which, upon failure of the crowbar switch, the failed crowbar switch forms a short circuit that permits current to pass through the crowbar switch.

2. A crowbar circuit according to claim 1 wherein the crowbar switch is a solid-state switch, a thyratron or a triggered spark gap.

3. A crowbar circuit according to claim 1 wherein the secondary switching block further includes a resistive element connected in series with the switching element in the secondary switching block, a junction between the resistive element and the switching element is connected to the control electrode of the crowbar switch, and the resistive element is connected across the control electrode and an anode of the crowbar switch, wherein an impedance of the resistive element is variable to selectively modify current flow in the secondary switching block.

4. A crowbar circuit according to claim 3 wherein the resistive element has a non-linear voltage-current characteristic.

5. A switching device comprising:
   a primary switching block including:
      at least one switching module, the switching module including at least one semiconductor switch switchable to selectively allow current to flow through that switching module; and
      a switching control unit to control the switching of the semiconductor switch;
   wherein the switching device further includes a crowbar circuit according to claim 1, wherein the crowbar switch is switchable to selectively allow current to flow through the crowbar switch in order to bypass the or each switching module; and the switching element is in communication with the switching control unit to receive, in use, a control signal generated by the switching control unit when the primary switching block is operating within predefined operating parameters.

6. A switching device according to claim 5 further including an extinguishing block, wherein the extinguishing block includes a resistor element and/or an arrester element to absorb and dissipate energy, wherein the switching control unit controls the switching of the or each semiconductor switch to selectively commutate current from the primary switching block to the extinguishing block.

7. A switching device according to claim 5 further including a snubber circuit, wherein the snubber circuit includes an energy storage device, and the extinguishing block is connected across the energy storage device.

8. A switching device according to claim 7 wherein the snubber circuit further includes:
   a passive current check element connected in series with the energy storage device; and
   a resistor element connected across the passive current check element.

9. A switching device according to claim 5 wherein the primary switching block includes a plurality of parallel-connected switching modules and/or at least one switching module includes a plurality of parallel-connected switching sub-modules, each switching sub-module including one or more semiconductor switches.

10. A switching device according to claim 5 further including at least one current sensor to measure a current in the or each switching module and/or the or each switching sub-module, the switching control unit being in communication with the or each current sensor to receive, in use, current measurement information from the or each current sensor, wherein the switching control unit does not generate the control signal when one or more switching modules and/or switching sub-modules has a current therein that falls outside a predetermined current range.

11. A switching device according to claim 10 wherein a current in the or each switching module and/or the or each switching sub-module that falls outside the predetermined current range corresponds to failure or impending failure of one or more switching modules and/or one or more switching sub-modules.

12. A switching device according to claim 10 wherein the or each current sensor includes a resistive shunt, an inductor, a current transformer and/or a Rogowski coil, the or each current sensor being connected in series with the or each switching module and/or the or each switching sub-module.

13. A switching device according to claim 5 further including at least one voltage sensor to measure a voltage across the or each switching module, the switching control unit being in communication with the or each voltage sensor to receive, in use, voltage measurement information from the or each voltage sensor, wherein the switching control unit does not generate the control signal when one or more switching modules has a voltage thereacross that matches or exceeds a predetermined voltage threshold, and the predetermined voltage threshold corresponds to failure of the or each switching module.

14. A circuit interruption device comprising:
   a main branch;
   an auxiliary branch and
   first and second terminals for connection, in use, to an electrical network, wherein the main and auxiliary branches extend between the first and second terminals
   wherein the main branch includes a switching apparatus switchable to selectively allow current to flow in the main branch in a first mode of operation or commutate current from the main branch to the auxiliary branch in a second mode of operation,
   the circuit interruption device further includes at least one extinguishing block, the or each extinguishing block including a resistor element and/or an arrester element to absorb and dissipate energy in the second mode of operation, and the auxiliary branch includes at least one switching device according to claim 5, wherein the primary switching block of the or each switching device includes at least one switching module, the or each switching module including at least one semiconductor switch switchable to selectively allow current to flow through that switching module in the second mode of operation or commutate current from that switching block to the or each corresponding extinguishing block in order to absorb and dissipate energy in the second mode of operation.

15. A circuit interruption device according to claim 14 wherein at least one extinguishing block is connected across the auxiliary branch.

16. A circuit interruption device according to claim 14 further including a plurality of passive current check elements connected in parallel with the auxiliary branch to define a full-bridge arrangement between the first and second terminals.

* * * * *